(12) United States Patent
Kim et al.

(10) Patent No.: US 8,928,222 B2
(45) Date of Patent: Jan. 6, 2015

(54) ORGANIC ELECTROLUMINESCENT DISPLAY DEVICE AND METHOD AND APPARATUS OF MANUFACTURING THE SAME

(75) Inventors: Myung-Seop Kim, Seoul (KR); Jeong-Dae Seo, Incheon-Gwangyeoksi (KR); Jong-Moo Lee, Gyeonggi-Do (KR); Hyun-Ju Choi, Seoul (KR); Chang-Wook Han, Seoul (KR); Yoon-Heung Tak, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 116 days.

(21) Appl. No.: 12/500,201

(22) Filed: Jul. 9, 2009

(65) Prior Publication Data

US 2010/0127615 A1    May 27, 2010

(30) Foreign Application Priority Data

Nov. 21, 2008  (KR) .......................... 10-2008-0116444

(51) Int. Cl.
| | |
|---|---|
| H05B 33/00 | (2006.01) |
| H01L 27/32 | (2006.01) |
| B30B 5/02 | (2006.01) |
| H01L 51/52 | (2006.01) |
| H05B 33/10 | (2006.01) |

(52) U.S. Cl.
CPC .............. *H01L 27/3251* (2013.01); *B30B 5/02* (2013.01); *H01L 51/5237* (2013.01); *H01L 27/3246* (2013.01); *H01L 27/3253* (2013.01); *H01L 2924/0002* (2013.01)

USPC .......................................... 313/512; 313/504

(58) Field of Classification Search
USPC ........................................................ 313/512
See application file for complete search history.

(56) References Cited

U.S. PATENT DOCUMENTS

| | | | |
|---|---|---|---|
| 5,180,523 A | 1/1993 | Durand et al. | |
| 5,307,190 A * | 4/1994 | Wakita et al. | ................. 349/158 |
| 6,774,574 B1 * | 8/2004 | Koyama | ..................... 315/169.3 |
| 6,914,661 B2 * | 7/2005 | Masuda et al. | ................ 349/190 |
| 6,965,361 B1 | 11/2005 | Sheats et al. | |
| 2002/0068191 A1 | 6/2002 | Kobayashi | |

(Continued)

FOREIGN PATENT DOCUMENTS

| | | |
|---|---|---|
| CN | 1212380 A | 3/1999 |
| CN | 1383351 A | 12/2002 |

(Continued)

OTHER PUBLICATIONS

European Office Action dated Dec. 11, 2012, issued in a corresponding European patent application.

(Continued)

*Primary Examiner* — Nimeshkumar Patel
*Assistant Examiner* — Jacob R Stern
(74) *Attorney, Agent, or Firm* — Morgan, Lewis & Bockius LLP

(57) ABSTRACT

A an organic electroluminescent display device includes an array substrate including a driving thin film transistor in a pixel region on a first substrate; an opposing substrate including an organic electroluminescent diode in the pixel region on a second substrate; an adhesive layer filling a space between the array substrate and the opposing substrate; and a connection spacer to electrically connect the organic electroluminescent diode with the driving thin film transistor.

17 Claims, 13 Drawing Sheets

(56) References Cited

U.S. PATENT DOCUMENTS

| | | |
|---|---|---|
| 2002/0069961 A1 | 6/2002 | Kobayashi et al. |
| 2003/0127972 A1* | 7/2003 | Han et al. ............... 313/504 |
| 2004/0263740 A1* | 12/2004 | Sakakura et al. ......... 349/138 |
| 2005/0093784 A1 | 5/2005 | Sakurai |
| 2005/0095409 A1 | 5/2005 | Koeda et al. |
| 2005/0116636 A1 | 6/2005 | Kang |
| 2005/0264189 A1* | 12/2005 | Choi et al. ............... 313/506 |
| 2005/0287392 A1* | 12/2005 | Toyoda .................... 428/690 |
| 2006/0255322 A1 | 11/2006 | Wu et al. |
| 2007/0090387 A1* | 4/2007 | Daniels et al. ............ 257/99 |
| 2007/0159096 A1* | 7/2007 | Oh et al. .................. 313/512 |
| 2007/0165178 A1* | 7/2007 | Ohnishi .................... 349/153 |
| 2008/0001533 A1* | 1/2008 | Kim et al. ................. 313/504 |
| 2008/0001864 A1 | 1/2008 | Lee et al. |
| 2008/0018245 A1 | 1/2008 | Kim et al. |
| 2008/0150419 A1* | 6/2008 | Kang ........................ 313/504 |

FOREIGN PATENT DOCUMENTS

| | | |
|---|---|---|
| CN | 1992371 A | 7/2007 |
| CN | 101083277 A | 12/2007 |
| EP | 1282162 A2 | 2/2003 |
| JP | 2002244589 A | 8/2002 |
| KR | 10-2002-0020218 | 3/2002 |
| KR | 10-2005-0002572 | 1/2005 |
| KR | 10-2007-0062250 | 6/2007 |
| KR | 10-2008-0057584 | 6/2008 |

OTHER PUBLICATIONS

Office Action dated Jun. 3, 2013 from the European Patent Office.

Office Action dated Jan. 29, 2013, issued by the Korean Intellectual Property Office in a corresponding Korean patent application.

* cited by examiner

ORGANIC ELECTROLUMINESCENT DISPLAY DEVICE AND METHOD AND APPARATUS OF MANUFACTURING THE SAME

The present invention claims the benefit of Korean Patent Application No. 2008-0116444, filed in Korea on Nov. 21, 2008, which is hereby incorporated by reference for all purposes as if fully set forth herein.

BACKGROUND OF THE INVENTION

1. Field of the Invention

The present invention relates to an organic electroluminescent display device, and more particularly, to an organic electroluminescent display (OELD) device and a method and an apparatus of manufacturing the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, organic electroluminescent display (OELD) devices are self-luminescent display devices. The OELD devices operate at low voltages and have a thin profile. Further, the OELD devices have fast response time, high brightness, and wide viewing angles.

FIG. 1 is a circuit diagram illustrating an OELD device according to the related art.

Referring to FIG. 1, the OELD device includes a gate line GL and a data line DL crossing each other to define a pixel region P.

In the pixel region P, a switching thin film transistor Ts, a driving thin film transistor Td, a storage capacitor Cst and an organic electroluminescent diode E are formed. A gate electrode and a source electrode of the switching thin film transistor Ts are connected to the gate line GL and the data line DL, respectively. A gate electrode of the driving thin film transistor Td is connected to the drain electrode of the switching thin film transistor Ts. Both electrodes of the storage capacitor Cst are connected to the gate electrode and a source electrode of the driving thin film transistor Td, respectively. The source electrode of the driving thin film transistor Td is connected to a power line PL. An anode of the organic electroluminescent diode E is connected to the drain electrode of the driving thin film transistor Td, and a cathode of the organic electroluminescent diode E is grounded.

When an ON gate voltage is applied to the gate line GL, the switching thin film transistor Ts is turned on, and a data voltage is applied to the data line D. The data voltage passes through the turned-on switching thin film transistor Ts and is applied to the gate electrode of the driving thin film transistor Td. A current passing through the driving thin film transistor Td is adjusted according to the data voltage applied to the driving thin film transistor Td, and the current flows on the organic electroluminescent diode E. The storage capacitor Cst stores the data voltage applied to the driving thin film transistor while the switching thin film transistor Ts is turned off.

The switching and driving thin film transistors Ts and Td and the organic electroluminescent diode E are usually formed on the same substrate of the OELD device. However, forming the thin film transistors and the organic electroluminescent diode on different substrates has recently researched and developed. This type of OELD device is referred to as a dual plate type OELD device.

FIG. 2A is a cross-sectional view illustrating a dual plate type OELD device according to the related art.

Referring to FIG. 2A, the OELD device 1 includes an array substrate and an opposing substrate facing each other. The OELD device 1 includes a display region AA to display images and a non-display region NAA.

The array substrate includes a gate line (not shown) and a data line DL formed on a first substrate 5 and crossing each other to define a pixel region P in the display region AA. A switching thin film transistor (not shown) and a driving thin film transistor Td are formed on the first substrate 5. The data line DL is formed in a data region D, and the driving thin film transistor Td is formed in a driving region Dr.

The driving thin film transistor Td includes a gate electrode 25 connected to the gate line, a semiconductor layer 42, a source electrode 32 and a drain electrode 34. A gate insulating layer 45 is on the gate electrode 25 and the gate line. The semiconductor layer 42 includes an active layer 40 made of intrinsic amorphous silicon and an ohmic contact layer 41 made of impurity-doped amorphous silicon.

A passivation layer 55 is formed on the driving thin film transistor Td and has a drain contact hole DCH exposing the drain electrode 34. A connection electrode 70 is connected to the drain electrode 34 through the drain contact hole DCH.

The opposing substrate includes an organic electroluminescent diode E formed on a second substrate 10. The organic electroluminescent diode E includes a first electrode 80, an organic emitting layer 82 and a second electrode 84.

An auxiliary electrode 60 is on the second substrate 10. The first electrode 80 is on the auxiliary electrode 60. A buffer layer 62 is on the first electrode 80. A separator 64 and a patterned spacer 50 are formed on the buffer layer 62.

The separator 64 has a tapered shape, and the patterned spacer 50 has a reverse-tapered shape. The organic emitting layer 82 and the second electrode 84 are formed on the first electrode 80 and the patterned spacer 50 in the pixel region P.

A portion of the second electrode 84 on the patterned spacer 50 contacts the connection electrode 70 so that the organic electroluminescent diode E on the second substrate 10 is electrically connected to the driving thin film transistor Td on the first substrate 5.

A seal pattern 90 is formed along a peripheral region of the array substrate and the opposing substrate to attach the array substrate and the opposing substrate. Further, the seal pattern 90 functions to keep a cell gap of the OELD device i.e, a gap between the array substrate and the opposing substrate. A space between the array substrate and the opposing substrate is under vacuum.

FIG. 2B is a cross-sectional view illustrating another OELD device according to the related art. The OELD device of FIG. 2B is similar to that of FIG. 2A. Explanations of parts similar to parts of FIG. 2A are omitted.

Referring to FIG. 2B, the OELD device 1 does not include the connection electrode and the patterned spacer (70 and 50 of FIG. 2A). A conductive spacer 52 connects a drain electrode 34 and an organic electroluminescent diode E.

By the sealant 90 of each of FIGS. 2A and 2B along the peripheral portion, the space between the array substrate and the opposing substrate is sealed from the outside. Accordingly, the space between the array substrate and the opposing substrate is empty under vacuum. However, the OELD device having the empty space is weak to exterior impact or pressure, and contact defects between the organic electroluminescent diode E and the driving thin film transistor Td are thus frequently caused. Accordingly, display quality and production efficiency are reduced.

Further, in experiment that the OELD device 1 is under conditions of about 80° C. and humidity of about 95%, moisture permeates inside the space through interfaces between the sealant 90 and the substrates 5 and 10, and lighting defects thus occur about 200 hours later. Accordingly, it is difficult for the OELD device 1 to obtain long lifetime.

To resolve this problem due to the moisture permeation, forming a passivation layer or a metal layer of calcium (Ca), magnesium (Mg) or aluminum (Al) on the second electrode 84 is suggested. However, the passivation layer or the metal layer does not completely cover the organic electroluminescent diode E. For example, a portion of the organic electroluminescent diode E near the separator 64 is not covered by the passivation layer or the metal layer. Accordingly, the moisture permeates into the not-covered portion of the organic electroluminescent diode E, and defects thus occur.

Further, in the process of forming the passivation layer or the metal layer, impurities of several micrometers are frequently stuck to the opposing substrate. Portions where the impurities are stuck become dark spots, and display quality and production efficiency are reduced.

Further, as the OELD increases in size, due to a difference of light exposure amount between a center portion and a peripheral portion of the OELD device, it becomes more difficult to form the patterned spacers so as to make thickness uniform over the entire plane of the OELD device. Accordingly, contact defects between the organic electroluminescent diode and the driving thin film transistor in some pixels are caused, and thus display quality and production efficiency are reduced.

SUMMARY OF THE INVENTION

Accordingly, the present invention is directed to an organic electroluminescent display device and a method and an apparatus of manufacturing the same that substantially obviates one or more of the problems due to limitations and disadvantages of the related art.

An advantage of the present invention is to provide an organic electroluminescent display device and a method and an apparatus of manufacturing the same that can improve display quality and production efficiency.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display device includes an array substrate including a driving thin film transistor in a pixel region on a first substrate; an opposing substrate including an organic electroluminescent diode in the pixel region on a second substrate; an adhesive layer filling a space between the array substrate and the opposing substrate; and a connection spacer to electrically connect the organic electroluminescent diode with the driving thin film transistor.

In another aspect, an apparatus of manufacturing an organic electroluminescent display device includes a first chamber including a first space, wherein an array substrate and an opposing substrate are in the first chamber, and wherein a first air pressure of the first space is adjustable; a second chamber including a second space; and a pad separating the first space and the second space, wherein the pad is flexible such that, due to the first air pressure less than the second air pressure, the pad presses one of the array substrate and the opposing substrate to attach the array substrate and the opposing substrate with an adhesive layer therebetween.

In another aspect, a method of manufacturing an organic electroluminescent display device includes placing an array substrate and an opposing substrate in a first chamber; and adjusting a first air pressure of the first space less a second air pressure of a second space of a second chamber, whereby a flexible pad, which separates the first and second spaces, presses one of the array substrate and the opposing substrate to attach the array substrate and the opposing substrate with an adhesive layer therebetween It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

Figure 3:
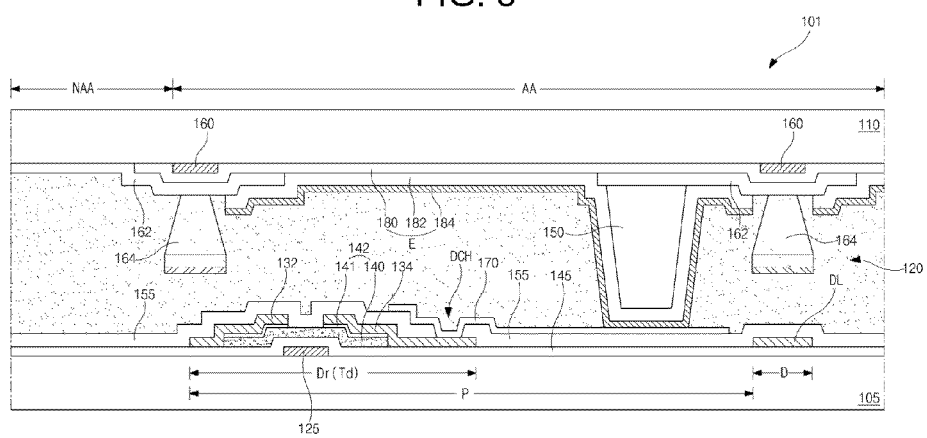
FIG. 3 is a cross-sectional view illustrating a dual plate type OELD device according to a first embodiment of the present invention.

FIG. 3 is a cross-sectional view illustrating a dual plate type OELD device according to a first embodiment of the present invention.

Referring to FIG. 3, the OELD device 101 includes an array substrate and an opposing substrate. The OELD device 101 includes a display region AA to display images and a non-display region NAA. The non-display region NAA is a peripheral region of the OELD device 101. The non-display region NAA may surround the display region AA. The display region AA may include a plurality of pixel regions P in a matrix form.

The array substrate includes a gate line (not shown) and a data line DL on a first substrate 105 to cross each other to define the pixel region P. The data line DL is formed in a data region D. In the pixel region P, a switching thin film transistor (not shown) and a driving thin film transistor Td are formed. The switching thin film transistor is connected to the corresponding gate line and data line DL. The driving thin film transistor Td is formed in a driving region Dr. Even though not shown in FIG. 3, a gate electrode 125 of the driving thin film transistor Td is connected to a drain electrode of the switching thin film transistor. The driving thin film transistor Td includes the gate electrode 125, a semiconductor layer 142, and source and drain electrodes 132 and 134 spaced apart from each other. The switching thin film transistor may have a structure similar to the structure of the driving thin film transistor Td. The semiconductor layer 142 includes an active layer 140 of intrinsic amorphous silicon, and an ohmic contact layer 141 of impurity-doped amorphous silicon.

A gate insulating layer 145 is formed on the gate electrode 125 and the gate line. The gate insulating layer 145 may be made of an inorganic insulating material. The inorganic insulating material may include silicon nitride (SiNx) and silicon oxide (SiO$_2$).

A passivation layer 155 is formed on the switching thin film transistor and the driving thin film transistor Td. The passivation layer 155 includes a drain contact hole DCH exposing the drain electrode 134. The passivation layer 155 may be made of an organic insulating material or an inorganic insulating material. The organic insulating material may include benzocyclobutene (BCB) and photo acrylic. The inorganic insulating material may include silicon nitride (SiNx) and silicon oxide (SiO$_2$).

A connection electrode 170 is formed on the passivation layer 155 in the pixel region P. The connection electrode 170 is connected to the drain electrode 134 through the drain contact hole DCH. The connection electrode 170 may have a double-layered structure. For example, the connection electrode 170 has a first layer and a second layer on the first layer. The first layer may be made of a transparent conductive material such as indium-tin-oxide (ITO), indium-zinc-oxide (IZO) and indium-tin-zinc-oxide (ITZO). The second layer may be made of a material having a low resistance, for example, molybdenum (Mo) or molybdenum alloy such as molybdenum neodymium (MoNd).

The opposing substrate includes an auxiliary electrode 160 on a second substrate 110. The auxiliary electrode 160 may be formed between adjacent pixel regions P. The auxiliary electrode 160 may correspond to the data region D. A first electrode 180 is formed on the second substrate 110 having the auxiliary electrode 160. The auxiliary electrode 160 may be made of a material having a low resistance, for example, molybdenum (Mo) or molybdenum alloy such as molybdenum neodymium (MoNd). The first electrode 180 may be made of a transparent conductive material such as indium-tin-oxide (ITO), indium-zinc-oxide (IZO) and indium-tin-zinc-oxide (ITZO). Since the auxiliary electrode 160 has a low resistance, the auxiliary electrode 160 functions to compensate for a high resistance of the first electrode 180 of the transparent conductive material. Alternatively, the auxiliary electrode 160 may be eliminated.

A buffer pattern 162 is formed on the first electrode 180. The buffer pattern 162 may cover the auxiliary electrode 160. A separator 164 and a patterned spacer 150 are formed on the buffer pattern 162. The separator 164 is formed between adjacent pixel regions P. The patterned spacer 150 may be formed in the pixel region P.

The patterned spacer 150 may have a cross-sectional shape reverse to a cross-sectional shape of the separator 164. For example, the separator 164 has a tapered shape such that widths of the separator 164 increase in a vertical direction from the second substrate 110 to the first substrate 105. To the contrary, the patterned spacer 150 has a reversely tapered shape such that widths of the patterned spacer 150 decrease in the vertical direction from the second substrate 110 to the first substrate 105.

An organic emitting layer 182 and a second electrode 184 are sequentially formed on the first electrode 180 in the pixel region P. The second electrode 184 extends over the patterned spacer 150. The organic emitting layer 182 may extend over the patterned spacer 150. The organic emitting layer 182 and the second electrode 184 may be separated by each pixel region P due to the tapered shape of the separator 164 without a separate patterning process. The organic emitting layers 182 in R (red), G (green) and B (blue) pixel regions may be made of organic materials emitting R, G and B lights, respectively. The first electrode 180, the organic emitting layer 182 and the second electrode 184 forms an organic electroluminescent diode E.

The second electrode 184 may have a multiple-layered structure. For example, the second electrode 184 may have first to third layers. The first layer may be made of aluminum (Al) or aluminum alloy such as aluminum neodymium (AlNd), the second layer may be made of silver (Ag), and the third layer may be made of calcium (Ca). The first to third layers are sequentially located in the vertical direction from the second substrate 110 to the first substrate 105. The second electrode 184 may be a work function less than a work function of the first electrode 182.

The organic electroluminescent diode E may further include, for example, a hole injection layer and a hole transporting layer between the first electrode 180 and the organic emitting layer 182, and an electron injection layer and an electron transporting layer between the second electrode 184 and the organic emitting layer 182.

A portion of the second electrode 184 on the patterned spacer 150 contacts the connection electrode 170 so that the organic electroluminescent diode E is electrically connected to the driving thin film transistor Td. The patterned spacer 150 and the portion of the second electrode 184 may be referred to as a connection spacer to connect the organic electroluminescent diode E and the driving thin film transistor Td.

A space between the array substrate and the opposing substrate is filled with an adhesive layer 120. The adhesive layer 120 may be in solid phase. The adhesive layer 120 includes a conductive material such that an electrical connection between the organic electroluminescent diode E and the connection electrode 120 is stably made. Further, the adhesive layer 120 may further include a material having viscous and adhesive property.

The adhesive layer 120 may be made of a mixture which includes a base material of an inorganic compound material and an additive material of an organic compound material or organic/inorganic compound material. The inorganic compound material has conductivity and makes the stable electrical connection between the organic electroluminescent diode E and the connection electrode 170.

The inorganic compound material may include at least one of carbon black, carbon nanotube, semiconductor nanocrystal and metal nanocrystal. The organic compound material may include at least one of a pentacene group material and a PPV (poly<p-phenylene vinylene>) group material.

A weight % of the organic compound material or the organic/inorganic compound material to the inorganic compound material is equal to or more than 1 weight %. It is preferred that the adhesive layer 120 has a specific resistance equal to or less than $6*10^6$ Ωcm, a thermal conductivity equal to or more than 0.19 W/mK, and a water vapor transmission rate (WVTR) equal to or less than 1000 $g/m^2$ day. It is preferred that the adhesive layer 120 has a thickness equal to or more than 10 nm.

Since the adhesive layer 120 fills the space between the array substrate and the opposing substrate, the array substrate and the opposing substrate can be firmly attached and durability of the OELD device can be improved. In addition, since the adhesive layer 120 prevents moisture permeation, lifetime of the OELD device can increase. In addition, the organic electroluminescent diode E can be stably electrically connected to the connection electrode 170, for example, through a method of distributing conductive nano-particles in the adhesive layer 120. Accordingly, the electrical connection can be stably secured. Accordingly, even though the OELD device has a large size, the large-sized OELD device can have reliability. Therefore, display quality and production efficiency can be improved.

In more detail, conductive particles of the inorganic compound are distributed all over the adhesive layer 120 and spaced apart from one another. Accordingly, in a normal state, the adhesive layer 120 does not make an electrical path therein. When the adhesive layer 120 is applied with a pressure to attach the array substrate and the opposing substrate, the conductive particles are closely packed in the pressure-applied direction. In particular, if, in attaching the array substrate and the opposing substrate, the second electrode 184 does not directly contact the connection electrode 170, the adhesive layer 120 at a contact region where the second electrode 184 is supposed to contact the connection electrode 170 has very small thickness and is applied with the pressure. Accordingly, the conductive particles at the contact region are so closely packed and contact one another in the pressure-applied direction. Accordingly, these particles can make an electrical connection path between the second electrode 184 and the connection electrode 170. Therefore, even though the second electrode 184 does not directly contact the connection electrode 170 in some pixel regions P due to some reasons, for example, non-uniformity of the thicknesses of the patterned spacers 150, the electrical connection can be stably made.

Meanwhile, since the adhesive layer 120 at other region of the pixel region P except for the contact region has a thickness too much thicker than the adhesive layer 120 at the contact region, most of the conductive particles at the other region do not contact one another along the pressure-applied direction. Accordingly, these conductive particles do not make an electrical connection path at the other region. Therefore, adjacent pixel regions P are not electrically connected to each other.

Figure 4A:
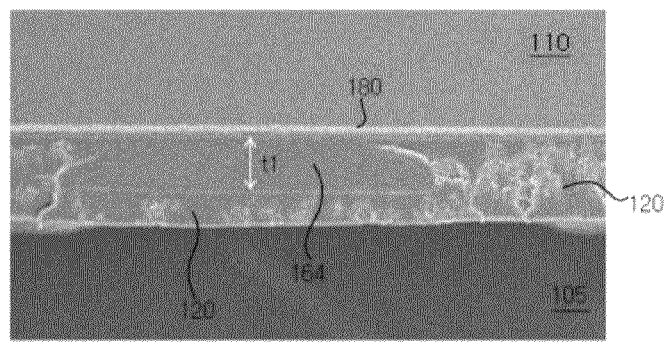
FIGS. 4A and 4B are SEM pictures of an OELD device, manufactured for experiment, according to the first embodiment of the present invention.
Figure 4B:
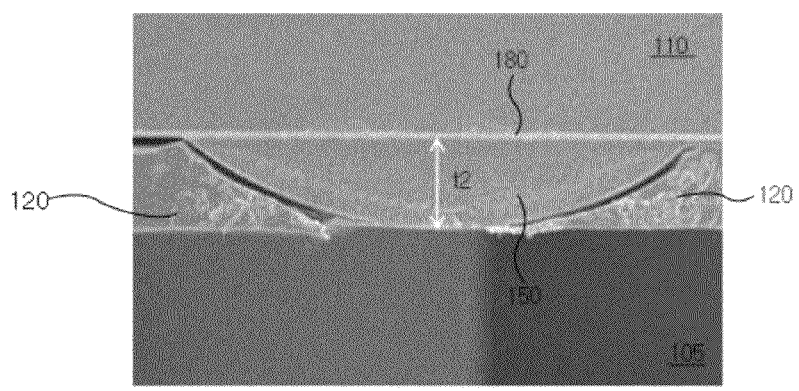
Figure 4C:
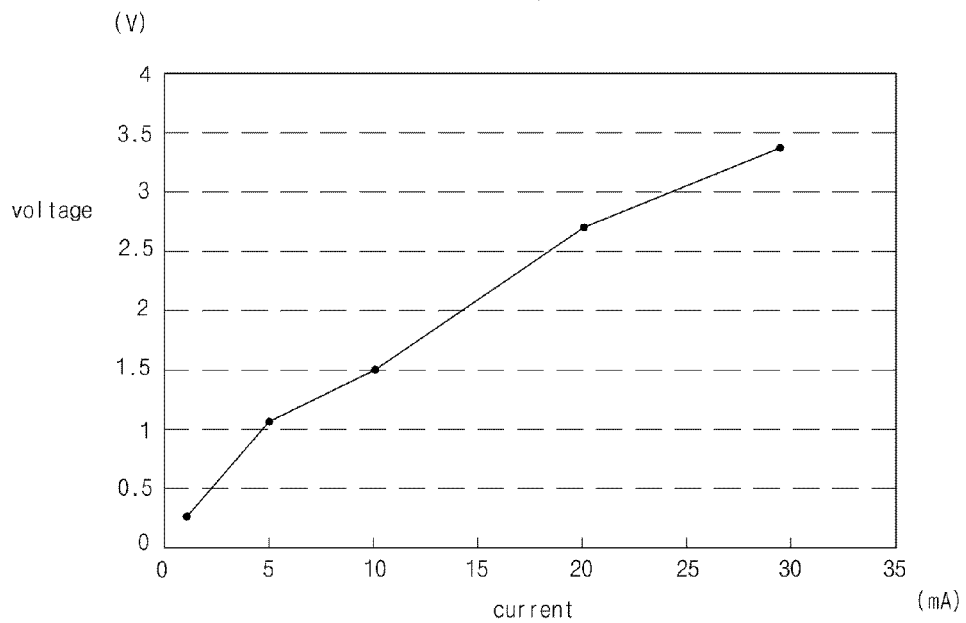
FIG. 4C is a graph illustrating an I-V curve of the driving thin film transistor of the OELD device according to the first embodiment of the present invention.
Figure 4D:
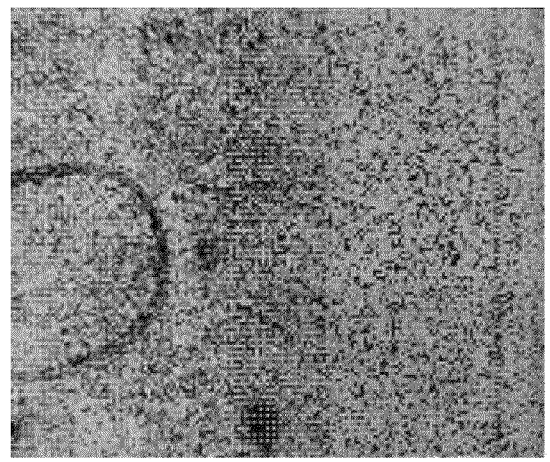
FIG. 4D is a picture of a lightning status of the OELD device according to the first embodiment of the present invention.

FIGS. 4A and 4B are SEM pictures of an OELD device, manufactured for experiment, according to the first embodiment of the present invention, FIG. 4C is a graph illustrating an I-V curve of the driving thin film transistor of the OELD device according to the first embodiment of the present invention, and FIG. 4D is a picture of a lightning status of the OELD device according to the first embodiment of the present invention.

The OELD device shown in FIGS. 4A and 4B is simply manufactured for experiment. In other words, an opposing substrate has a first electrode 180 on a second substrate 110 and a patterned spacer 150 and a separator 164 on the first electrode 180, an array substrate has a first substrate 105, and an adhesive layer 120 fills a space between the opposing substrate and the array substrate. In this OELD device, the separator 164 has a first thickness t1 of about 2 μm and the columned spacer 150 has a second thickness of about 3 μm.

Referring to FIGS. 4A and 4B, the array substrate and the opposing substrate are attached with the adhesive layer 120 therebetween. After the attaching, the patterned spacer 150 contacts the array substrate, and the separator 164 is spaced apart about 1 μm from the array substrate. In the attaching process of the array substrate and the opposing substrate, a pressure is applied to the array substrate and the opposing substrate. Accordingly, referring to FIGS. 4A and 4B, the adhesive layer 120 closely fills the space between the array substrate and the opposing substrate, and referring to FIG. 4B, the adhesive layer 120 at a contact region between the patterned spacer 150 and the array substrate is pushed out.

Referring to FIG. 4C, a current increases substantially in linear proportion to a voltage.

FIG. 4D shows a lighting status through an organic emitting layer emitting B (blue) light. Referring to FIG. 4D, in a lightning test, light is normally emitted.

As described above, the OELD device according to the first embodiment can be normally operated.

Figure 1:
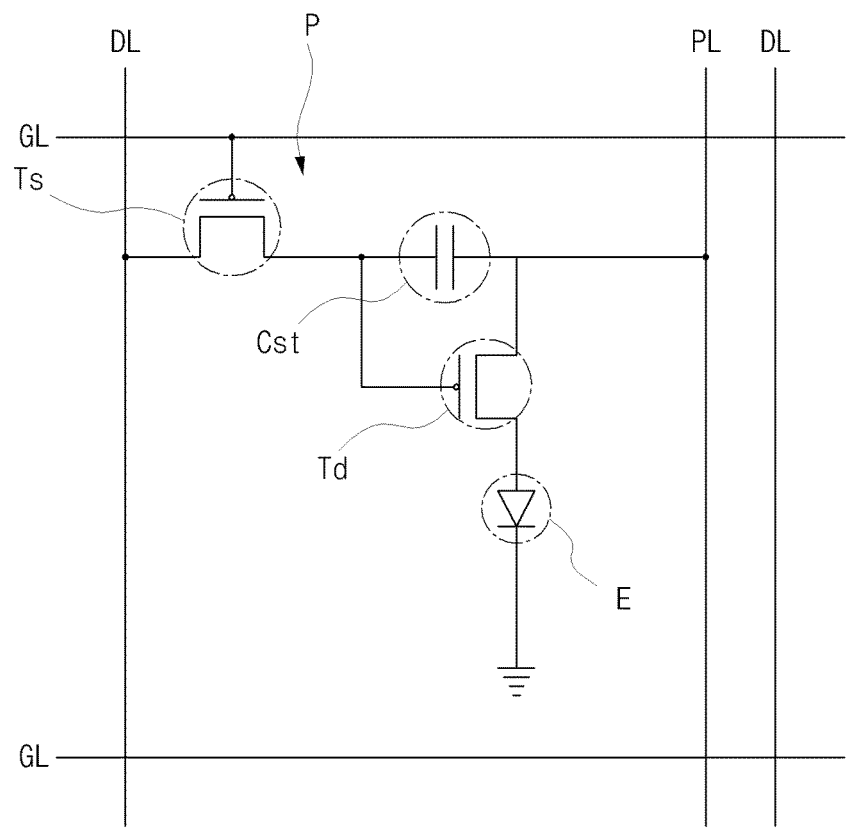
FIG. 1 is a circuit diagram illustrating an OELD device according to the related art.
Figure 2A:
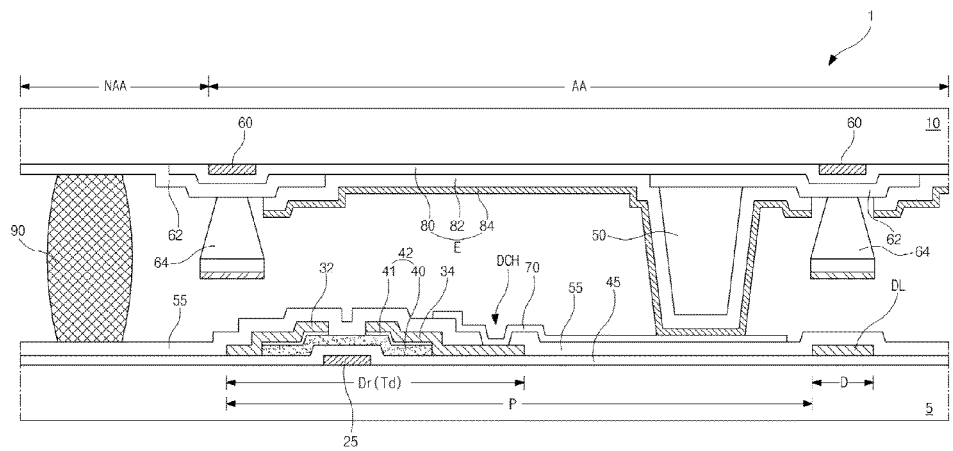
FIG. 2A is a cross-sectional view illustrating a dual plate type OELD device according to the related art.
Figure 2B:
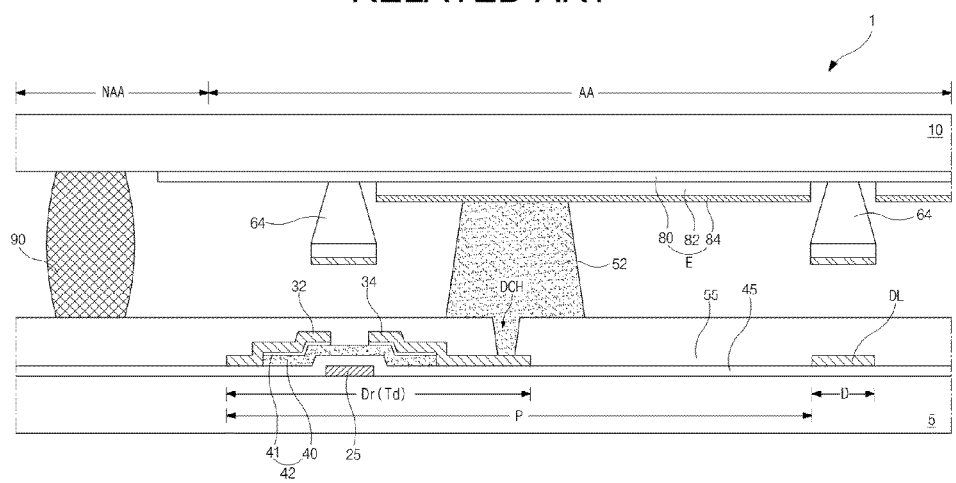
FIG. 2B is a cross-sectional view illustrating another OELD device according to the related art.

In the aforementioned first embodiment, it is mainly described that the organic electroluminescent diode and the driving thin film transistor are connected using the connection electrode and the connection spacer including the portion of the second electrode and the patterned spacer. However, other structures can be employed. For example, a structure including conductive connection spacer, which is similar to the structure of FIG. 2B, can be used. Alternatively, a structure modifying the structure of FIG. 3 can be employed that the passivation layer and the connection electrode are not used, the drain electrode extends in a side direction and contacts the portion of the second electrode on the patterned spacer. Alternatively, a structure can be employed that a patterned spacer is formed in the array substrate, and a portion extending from the drain electrode is on the patterned spacer and contacts the second electrode. In other words, various structures, in which the organic electroluminescent diode and the driving thin film transistor are connected through the connection spacer therebetween, can be employed.

FIGS. 5A to 5D are cross-sectional views illustrating method of attaching the array substrate and the opposing substrate according to the first embodiment of the present invention. In FIGS. 5A to 5D, for convenience's sake, the reference number 105 indicates an array substrate including a driving thin film transistor, and the reference number 110 indicates an opposing substrate including an organic electroluminescent diode.

Figure 5A:
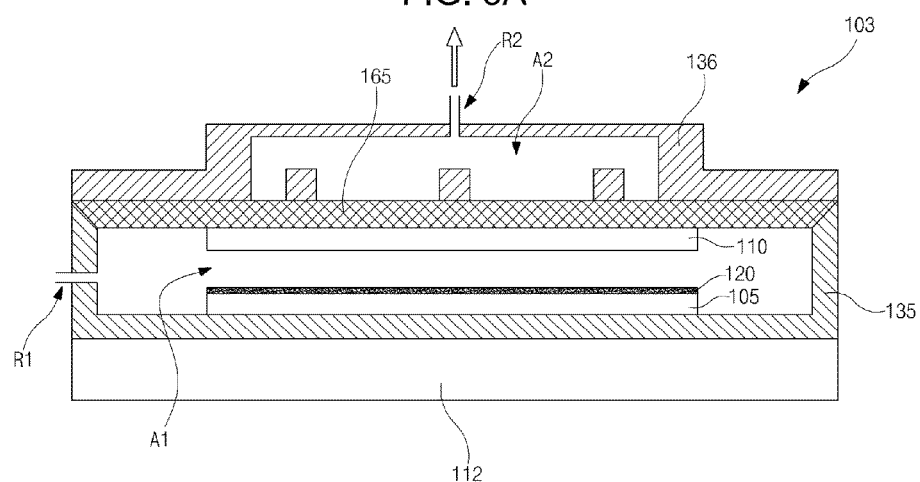
FIGS. 5A to 5D are cross-sectional views illustrating method of attaching the array substrate and the opposing substrate according to the first embodiment of the present invention.

Referring to FIG. 5A, an attaching apparatus 103 includes a first chamber 135 having a first space A1 therein and a second chamber 136 having a second space A2 therein. The attaching apparatus 103 may be referred to as a SPE (solid phase encapsulation) apparatus, and the method of attaching the array substrate and the opposing substrate according to the first embodiment may be referred to as a SPE method.

The attaching apparatus 103 further includes a pad 165 which is flexible and located between the first and second chambers 135 and 136 and separates the first space A1 and the second space A2.

An air pressure of the first chamber 135 may be adjustable. For example, the first chamber 135 may be in atmospheric state or in vacuum state according to operation of a first port R1 which is located at a side of the first chamber 135. Further, an air pressure of the second chamber 136 may be adjustable. For example, the second chamber 136 may be in atmospheric state or in vacuum state according to operation of a second port R2 which is located at a side of the second chamber 136.

Each of the first chamber 135 and the second chamber 136 may be made of quartz, and the pad 135 may be made of silicon. A heating device 112 may be located below the first chamber 135 to heat the first chamber 135. A coil or inductance heater may be used as the heating device 112.

The array substrate 105 and the opposing substrate 110 are placed in the first chamber 135 and position alignment is performed for the array substrate and opposing substrates 105 and 110. The array substrate 105 is spaced apart from the opposing substrate 110. The first chamber 135 is in atmospheric state while the second chamber 136 is in vacuum state.

A process of coating an adhesive layer 120 on one of the array substrate 105 and the opposing substrate is performed in the first chamber 135. For example, the adhesive layer 120 is coated on the array substrate 105. A spin coating method, an inkjet method, or a screen printing method may be used to coat the adhesive layer 120. Alternatively, the adhesive layer 120 may be manufactured in film type, and the film type adhesive layer 120 may be coated by a lamination method. It should be understood that the process of coating the adhesive layer 120 may be performed before loading the array substrate 105 into the first chamber 135.

Figure 5B:
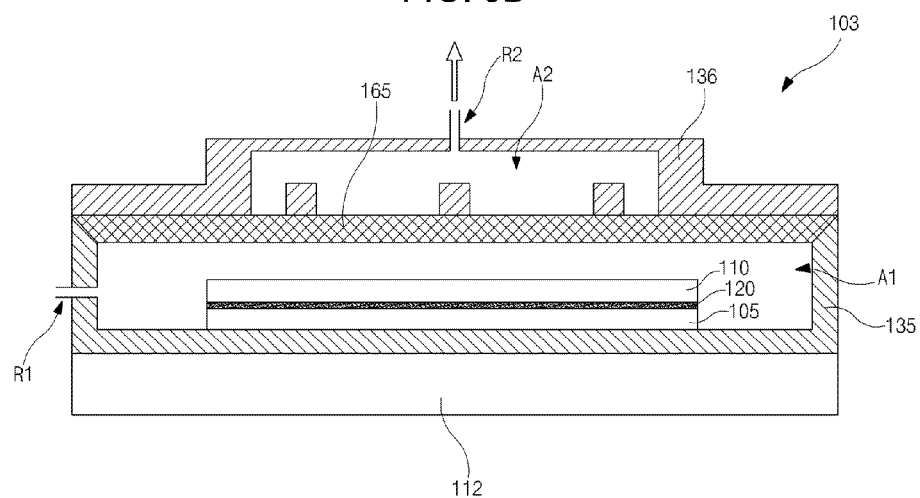

Referring to FIG. 5B, after coating the adhesive layer 120 on the array substrate 105, a process of contacting the opposing substrate 110 and the adhesive layer 120 is performed. For example, the opposing substrate 110 is placed on the adhesive layer 120. In this process, the first chamber 135 keeps atmospheric state, and the second chamber 136 keeps vacuum state.

Figure 5C:
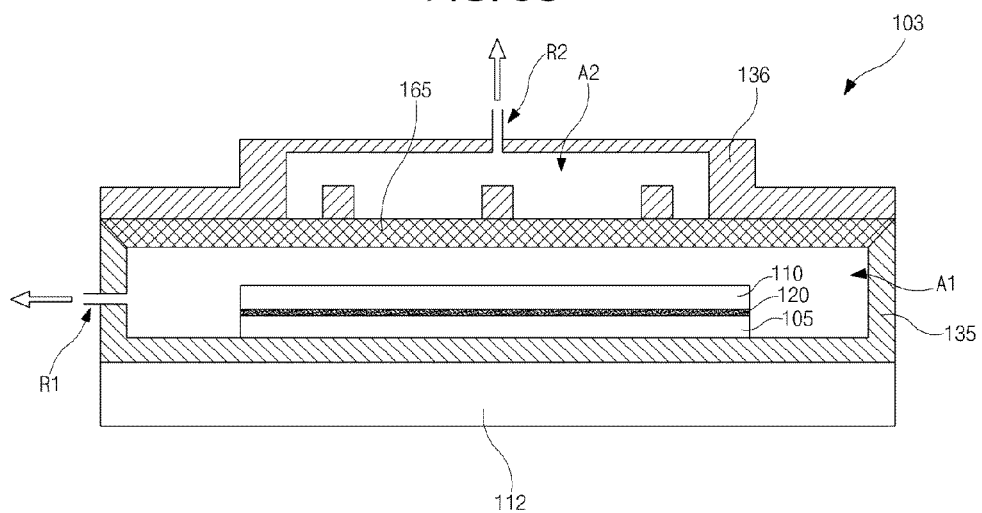

Referring to FIG. 5C, after contacting the opposing substrate 110 and the adhesive layer 120, a process of changing air pressure of the first chamber 135 is performed by an air pumping through the first port R1. For example, an air is pumped out from the first space A1, and thus atmospheric state is changed into vacuum state. Accordingly, the first chamber 135 may have an air pressure of about several miliTorrs (mTorrs).

Figure 5D:
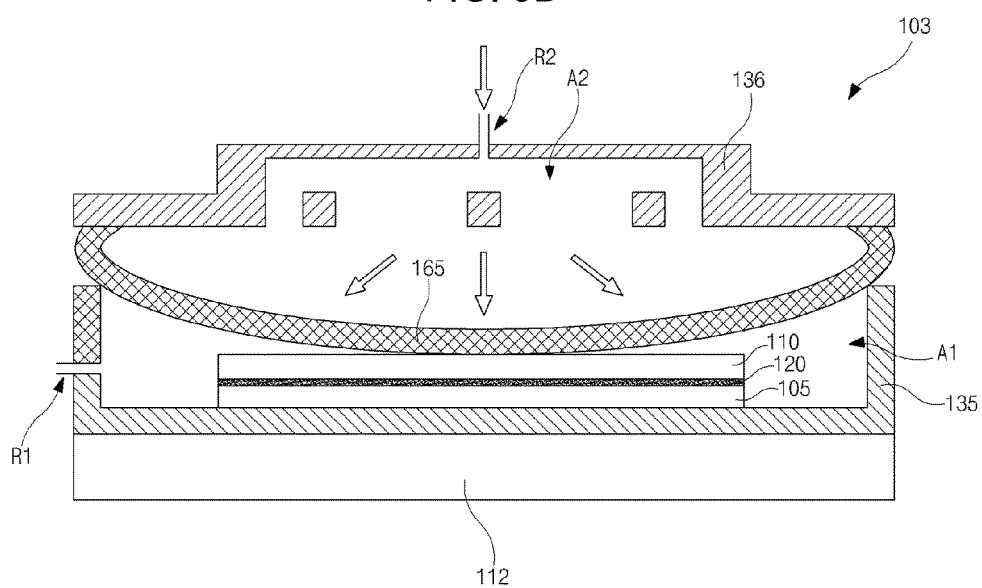

Referring to FIG. 5D, after changing atmospheric state of the first chamber 135 into vacuum state, a process of changing vacuum state of the second chamber 136 into atmospheric state is performed by an air pumping through the second port R2. For example, an air is pumped into the second spacer A2, and thus vacuum state is changed into atmospheric state. Accordingly, there occurs a difference between the air pressure of the first chamber 135 and the air pressure of the second chamber 136. In other words, the air pressure of the second space A2 is more than the air pressure of the first space A1. Due to this air pressure difference, the pad 165 is pushed toward the first space A1, and the pad 165 is bulged out and has a curved shape. Further, gravity may influence the modification of the pad 165.

The bulged pad 165 presses the opposing substrate 110. In other words, the air pressure difference functions as a pressure pressing the opposing substrate 110. Accordingly, the opposing substrate 110 can be firmly attached to the array substrate 105 with the adhesive layer 120 therebetween.

Further, when the pad 165 presses the opposing substrate 110, the heating device 112 may heat the array substrate 105. For example, the array substrate 105 may have a temperature of about 60° C. to about 150° C. This heating causes the adhesive layer 120 to be heated and have fluidity. Accordingly, due to the pressing by the pad 165 and the heating, the adhesive layer 120 hardly has any air space therein, and thus the adhesive layer 120 can be dense and be as thin as possible. Alternatively, after the pressing by the pad 165, the heating may be performed in an apparatus separate from the attaching apparatus 103, for example, an oven.

Through the aforementioned processes, firmly attaching the array substrate and the opposing substrate with the adhesive layer therebetween can be performed.

Figure 6A:
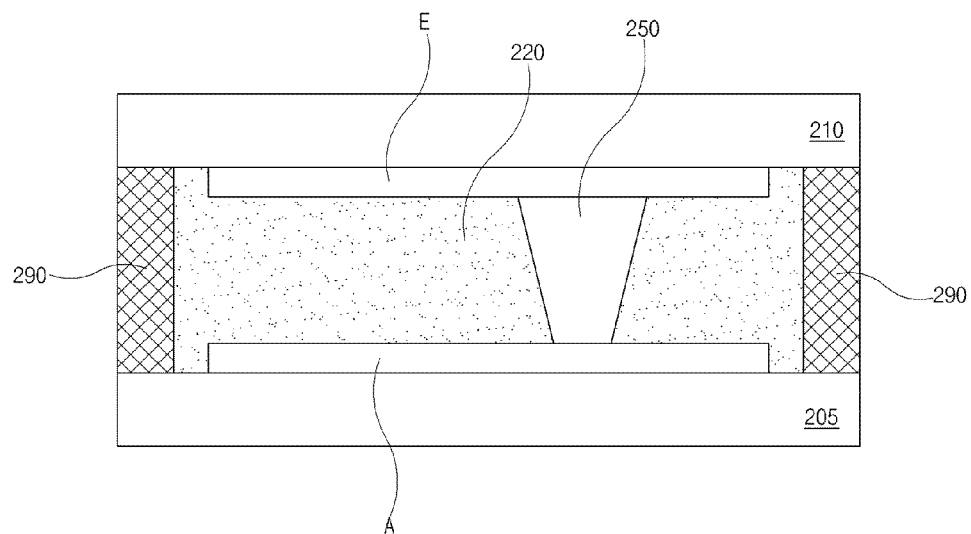
FIGS. 6A to 6C are cross-sectional views illustrating samples of dual plate type OELD devices according to a second embodiment of the present invention.
Figure 6B:
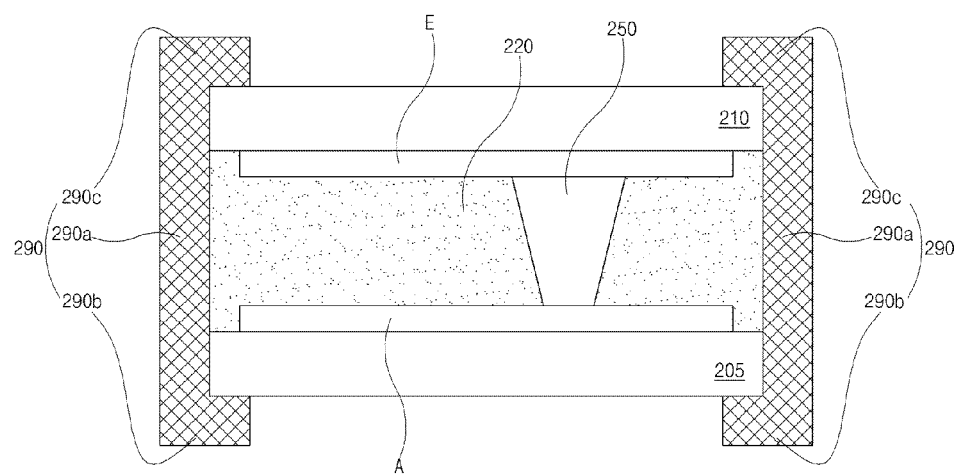
Figure 6C:
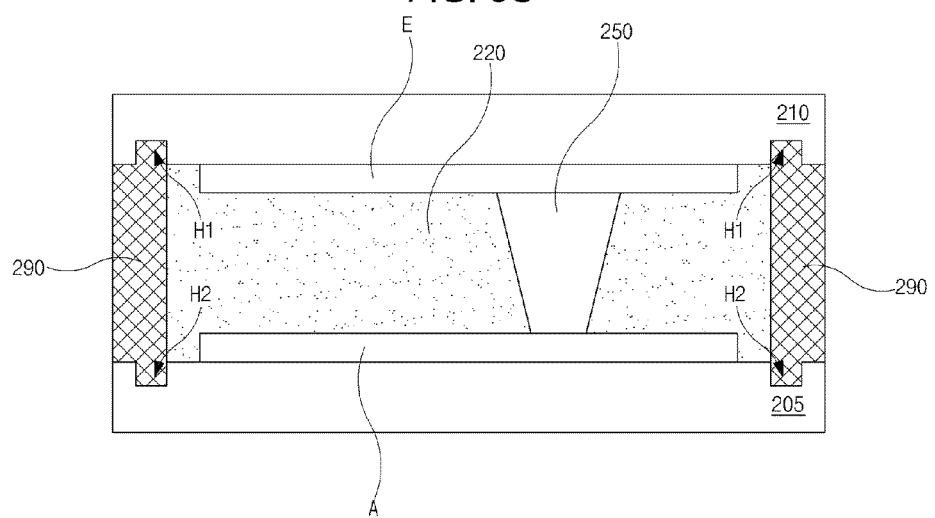

FIGS. 6A to 6C are cross-sectional views illustrating samples of dual plate type OELD devices according to a second embodiment of the present invention. In FIGS. 6A to 6C, for convenience's sake, the OELD devices are schematically described. Explanations to parts similar to parts of the first embodiment may be omitted.

Referring to FIGS. 6A to 6C, each of first to third sampled OELD devices includes an array substrate, an opposing substrate and an adhesive layer 220 filling a space between the array substrate and the opposing substrate. The array substrate includes an array element A on a first substrate 210, and the array element A may include a driving thin film transistor, a switching thin film transistor, gate and data lines, a connection electrode and the like. The opposing substrate includes an organic electroluminescent diode E on a second substrate 210. A patterned spacer 250 protrudes from the opposing substrate such that a second electrode of the organic electroluminescent diode E on the patterned spacer 250 is electrically connected to the driving thin film transistor.

A seal pattern 290 is formed in a non-display region of each OELD device. For example, the seal pattern 290 is along a peripheral region surrounding a display region of each OELD device. The adhesive layer 220 fills the space which is between the array substrate and the opposing substrate and surrounded by the seal pattern 290. The seal pattern 290 along with the adhesive layer 220 functions to attach the array substrate and the opposing substrate and keep a cell gap between the array substrate and the opposing substrate. Further, the seal pattern 290 along with the adhesive layer 220 prevents moisture from permeating into components of the OELD device. The seal pattern 290 of the first to third examples OELD devices may be different from one another.

In more detail, referring to FIG. 6A, the seal pattern 290 of the first exampled OELD device is formed between the array substrate and the opposing substrate and both ends of the seal pattern 290 contact an inner surface of the array substrate and an inner surface of the opposing substrate, respectively.

Referring to FIG. 6B, the seal pattern 290 of the second sampled OELD device surrounds sides of the OELD device. For example, the seal pattern 290 includes first to third portions 290a to 290c. The first portion 290a covers sides of the OELD device, and the second and third portions 290b and 290c covers an outer surface of the array substrate and an outer surface of the opposing substrate, respectively. The seal pattern 290 of FIG. 6B can firmly seal the inside of the OELD device more than that of FIG. 6A. Accordingly, the OELD device of FIG. 6B can effectively prevent moisture permeation more than that of FIG. 6A.

Referring to FIG. 6C, compared with the first sampled OELD device of FIG. 6A, the third sampled OELD device includes a first groove H1 at an inner surface of the opposing substrate and a second groove H2 at an inner surface of the array substrate. The first and second grooves H1 and H2 may be along the peripheral region of the OELD device. The first and second grooves H1 and H2 correspond to each other. In similar to the seal pattern 290 of the first sampled OELD device, the seal pattern 290 of the third sampled OELD device is formed between the array substrate and the opposing substrate, and both ends of the seal pattern 290 contact the inner surface of the array substrate and the inner surface of the opposing substrate, respectively. Further, the seal pattern 290 fills the first and second grooves H1 and H2. Because of the first and second grooves H1 and H2, an area of a region where the seal pattern 290 contacts the array substrate and the opposing substrate is more than that of FIG. 6A. In other words, a permeation path of moisture of FIG. 6C is longer than that of FIG. 6A. Accordingly, the OELD device of FIG. 6C can effectively prevent moisture permeation more than that of FIG. 6A.

Figure 7A:
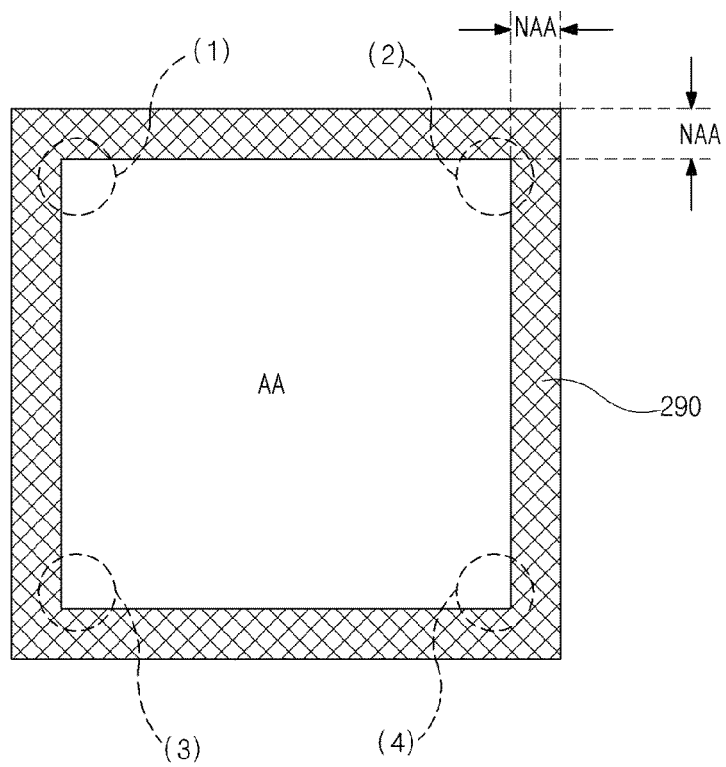
FIG. 7A is a schematic plan view illustrating an OELD device according to the second embodiment of the present invention.
Figure 7B:
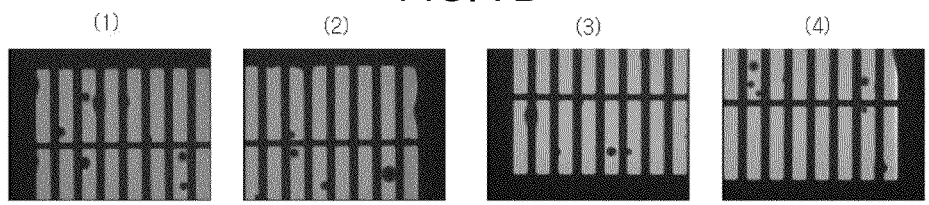
FIGS. 7B and 7C are pictures, of first to fourth regions of the OELD device of FIG. 7A, taken in reliability tests on the OELD device.
Figure 7C:
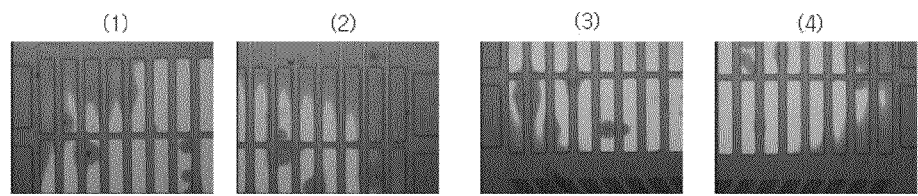

FIG. 7A is a schematic plan view illustrating an OELD device according to the second embodiment of the present invention, and FIGS. 7B and 7C are pictures, of first to fourth regions of the OELD device of FIG. 7A, taken in reliability tests on the OELD device.

Referring to FIG. 7A, the OELD device includes an array substrate and an opposing substrate with an adhesive layer therebetween. The OELD device includes a display region AA and a non-display region surrounding the display region NAA. A seal pattern 290 is at the non-display region NAA.

FIG. 7B shows lighting statuses of first to fourth regions (1) to (4) of the OELD device at a first elapsed time after the OELD device is transferred into a chamber under conditions that a temperature is about 80° C. and a humidity is about 95%, and FIG. 7C shows lighting status of first to fourth regions (1) to (4) of the OELD device at a second elapsed time after the OELD device is transferred into a chamber under conditions that a temperature is about 80° C. and a humidity is about 95%. The first and second elapsed times are about 500 hours and about 600 hours, respectively.

Referring to FIGS. 7B and 7C, it is shown that the lightning statuses are satisfactory until the first elapsed time (500 hours), but, at the second elapsed time (600 hours), non-lighting pixels occurs. When the same test is made on the related art OELD device, lightning defects occurs at a lapsed time of about 200 hours. Accordingly, the lifetime of the OELD can be extended to about twice or about three times of the lifetime of the related art OELD.

Figure 8A:
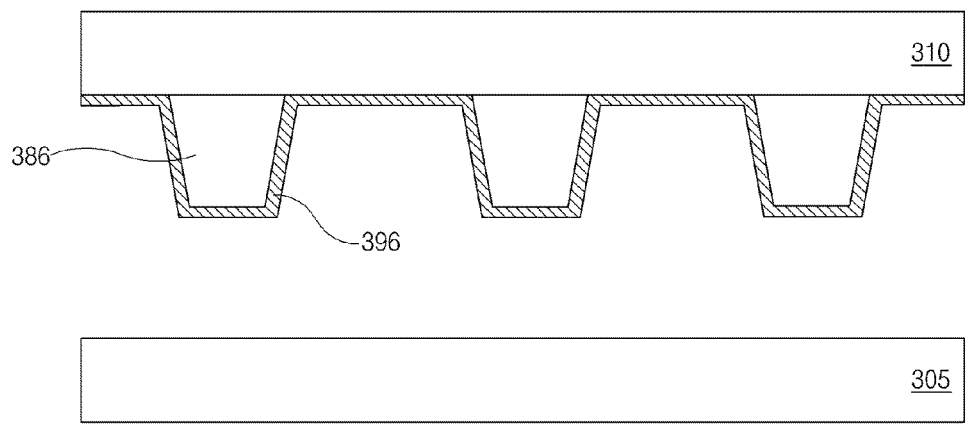
FIGS. 8A and 8B are cross-sectional views illustrating samples of dual plate type OELD devices according to a third embodiment of the present invention.
Figure 8B:
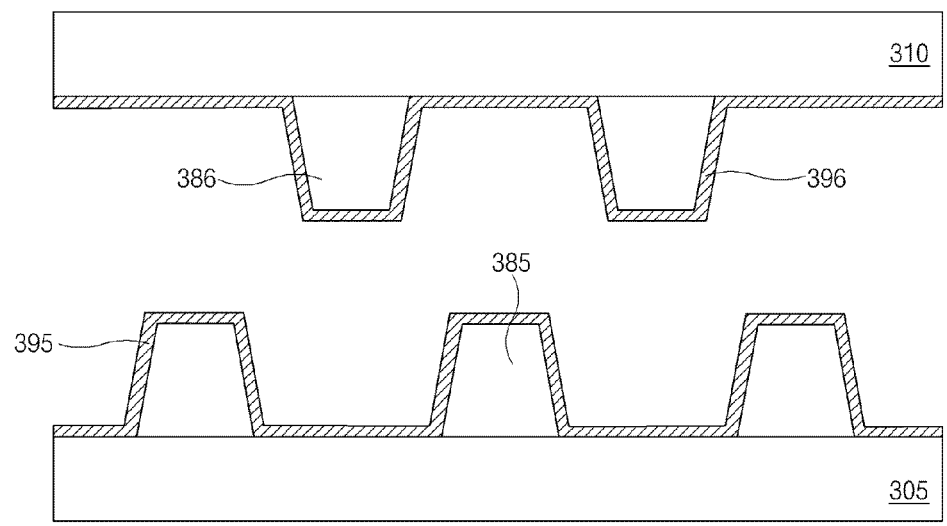

FIGS. 8A and 8B are cross-sectional views illustrating samples of dual plate type OELD devices according to a third embodiment of the present invention. In FIGS. 8A and 8B, for convenience's sake, peripheral regions of the OELD devices are schematically described. The OELD devices have a structure of a display region similar to that of the first embodiment. Explanations to parts similar to parts of the first embodiment may be omitted.

Referring to FIG. 8A, an opposing substrate includes at least one shield pattern 386 on a second substrate 310. A space between the array substrate and the opposing substrate is filled with an adhesive layer. The shield pattern 386 may be along a non-display region surrounding a display region. When a plurality of shield patterns 386, the shield patterns 386 may be spaced apart from and in parallel with one another. The shield pattern 386 may be formed in the same process as and formed of the same material as the patterned spacer (150 of FIG. 3). The shield pattern 386 may be spaced apart from the array substrate.

A metallic material may be coated on the shield pattern 386 so that a metal layer 396 may cover the shield pattern 386. The metal layer 396 functions to prevent the shield pattern 396 from reacting with moisture or oxygen ($O_2$) from the outside. The metal layer 396 may be formed in the same process as and formed of the same material as the second electrode (184 of FIG. 3).

Referring to FIG. 8B, an opposing substrate includes at least one second shield pattern 386 on a second substrate 310, and a second metal layer 396 covers the second shield pattern 386. Further, an array substrate includes at least one first shield pattern 385 on a first substrate 305, and a first metal layer 395 covers the second shield pattern 385. The first and second shield patterns 385 and 386 alternate and occlude. This structure is advantageous in preventing moisture permeation more than the structure of FIG. 8A. The first shield pattern 385 may be spaced apart from the opposing substrate, and the second shield pattern 386 may be spaced apart from the array substrate.

In the OELD devices of FIGS. 8A and 8B, the adhesive layer may be formed in the region where the shield patterns are formed. Further, the seal pattern of the second embodiment may be located outside and surround the shield patterns. When the seal pattern is further included in the OELD devices of the third embodiment along with the shield patterns and the adhesive layer, moisture permeation can be more effectively prevented.

Figure 9A:
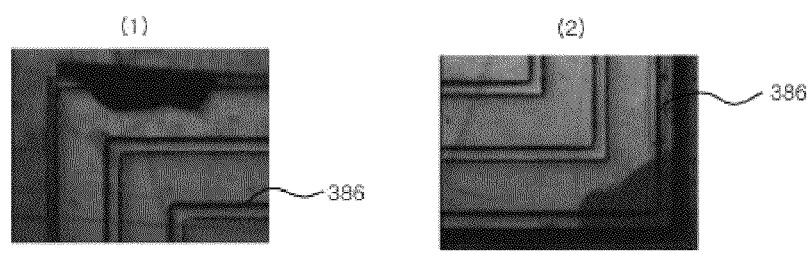
FIGS. 9A and 9B are pictures, of two corner regions of each of OELD devices according to the third embodiment of the present invention, taken in reliability tests on the OELD devices.
Figure 9B:
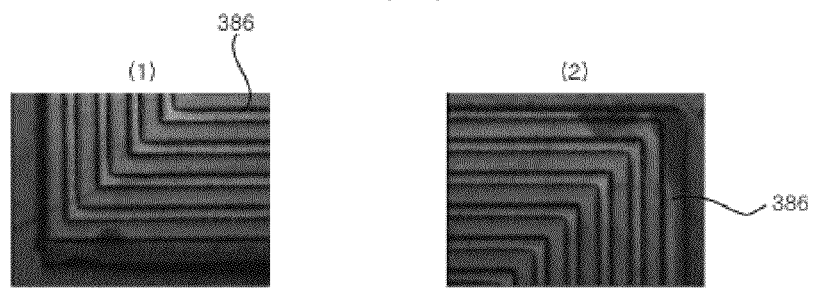

FIGS. 9A and 9B are pictures, of two corner regions of each of OELD devices according to the third embodiment of the present invention, taken in reliability tests on the OELD devices.

The test of FIG. 9A is made on an OELD device which has three shield patterns 386 having a width of about 60 μm, and the two corners (1) and (2) are two among four corners of the OELD device. When the three shield patterns 386 are used, defects on pixels due to moisture permeation occur from the outside of a display region into the inside after a lapsed time of about 1000 hours.

The test of FIG. 9B is made on an OELD device which has six shield patterns 386 having a width of about 60 μm, and the two corners (1) and (2) are two among four corners of the OELD device. When the six shield patterns 386 are used, defects on pixels due to moisture permeation occur from the outside of a display region into the inside after a lapsed time of about 1600 hours.

Figure 10:
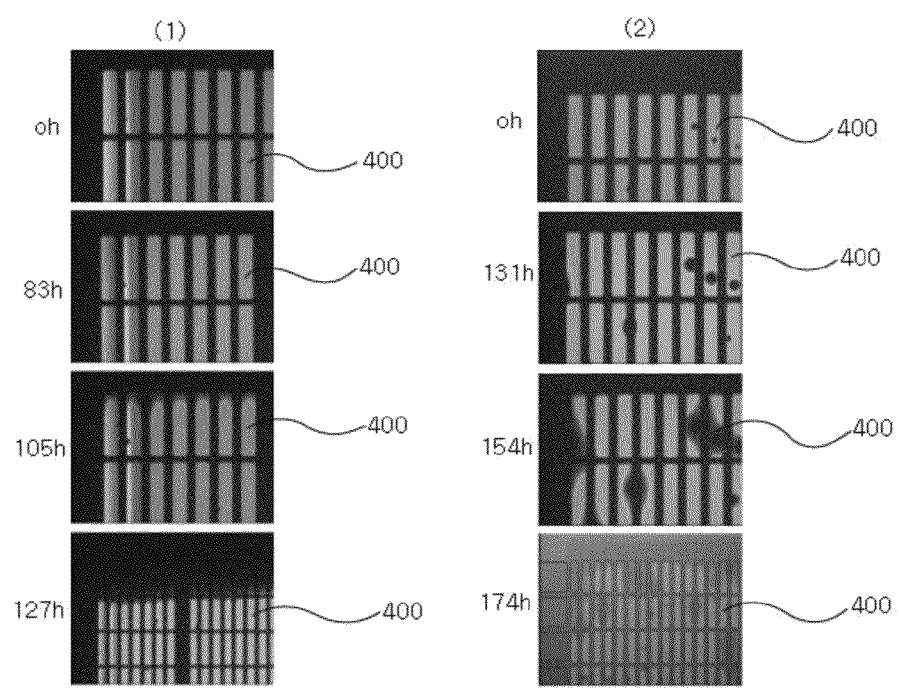
FIG. 10 is pictures, of a corner region of each of display regions of OELD devices according to the third embodiment of the present invention, taken in reliability tests on the OELD devices.

FIG. 10 is pictures, of a corner region of each of display regions of OELD devices according to the third embodiment of the present invention, taken in reliability tests on the OELD devices.

The test of FIG. 10 (1) is made on an OELD device which has shield patterns without a metal layer, and the test of FIG. 10 (2) is made on an OELD device which has shield patterns covered by a metal layer. The tests of FIG. 10 (1) and FIG. 10 (2) are performed under conditions that a temperature is about 80° C. and a humidity is about 95%.

Referring to FIG. 10 (1), when the shield patterns are not covered by a metal layer, it is shown that defects on pixels 400 due to moisture permeation progress from the top of a display region after a lapsed time of about 105 hours. In other words, moisture permeates through the shield patterns, and thus, the permeated moisture goes inside and pixels 400 are defected and reduced in area as time goes on. The reduction in size of the pixel 400 means that an effective area of the pixel 400 to emit light is reduced due to the moisture permeation, and this is seen in FIG. 10 (1).

Referring to FIG. 10 (2), when the shield patterns are covered by a metal layer, moisture hardly permeates through the shield patterns because of the metal layer covering the shield patterns. Accordingly, pixels 400 have substantially no defects even after about 154 hours and 174 hours. Therefore, it is seen that covering the shield patterns with the metal layer can have excellent advantage in increasing lifetime of the OELD device. It is noted that some dart spots on the pixels 400 in FIG. 10 (2) are not caused by moisture permeation but are caused by errors under the test.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    an array substrate including a driving thin film transistor in a pixel region on a first substrate;
    an opposing substrate including an organic electroluminescent diode in the pixel region on a second substrate;
    a separator corresponding to a boundary of the pixel region on the opposing substrate;
    an adhesive layer filling a space between the array substrate and the opposing substrate, the adhesive layer including conductive particles;
    a connection spacer configured to electrically connect the organic electroluminescent diode with the driving thin film transistor such that the adhesive layer disposes between the driving thin film transistor and the organic organic electroluminescent diode;
    at least one first shield pattern on one of an inner surface of the array substrate and an inner surface of the opposing substrate, the at least one first shield pattern surrounding the display region of the device; and
    at least one second shield pattern on the other of the inner surface of the array substrate and the inner surface of the opposing substrate, the at least one second shield pattern surrounding the display region of the device and alternating with the first shield pattern,
    wherein the first pattern and the second pattern occlude,
    wherein each of the first shield pattern and the second shield pattern has a first width equal to each other,
    wherein a distance between a neighboring two of the first shield patterns or a neighboring two of the second shield patterns has a second width equal to each other,
    wherein the second width is bigger than the first width, and
    wherein the second shield pattern comprises a same material as the connection spacer.
2. The device according to claim 1, wherein:
    the adhesive layer includes an inorganic compound material, and an organic compound material or an organic/inorganic compound material; and
    the inorganic compound material has conductivity.
3. The device according to claim 2, wherein the inorganic compound material includes at least one of carbon black, carbon nanotube, semiconductor nanocrystal, and metal nanocrystal.
4. The device according to claim 2, wherein the organic compound material includes at least one of a pentacene group material and a PPV (poly<p-phenylene vinylene>) group material.
5. The device according to claim 2, wherein a weight % of the organic compound material or the organic inorganic compound material to the inorganic compound material is equal to or more than 1 weight %.
6. The device according to claim 1, wherein the adhesive layer has a specific resistance equal to or less than $6*10^6$ Ω cm.
7. The device according to claim 1, wherein the adhesive layer has a thermal conductivity equal to or more than 0.19 W/mK.
8. The device according to claim 1, wherein the adhesive layer has a water vapor transmission rate (WVTR) equal to or less than 1000 g/m$^2$ day.
9. The device according to claim 1, wherein the adhesive layer has a thickness equal to or more than 10 nm.
10. The device according to claim 1, further comprising:
    a seal pattern surrounding a display region of the device,
    wherein both ends of the seal pattern contact an inner surface of the array substrate and an inner surface of the opposing substrate, respectively.
11. The device according to claim 10, wherein:
    the inner surface of the array substrate and the inner surface of the opposing substrate have first and second grooves, respectively; and
    the seal pattern fills the first and second grooves.
12. The device according to claim 1, further comprising a seal pattern covering sides of the device, an outer surface of the array substrate, and an outer surface of the opposing substrate.
13. The device according to claim 1, further comprising a metal layer covering the at least one first shield pattern.
14. The device according to claim 13, further comprising a metal layer covering the at least one second shield pattern.
15. The device according to claim 1, wherein:
    the array substrate further includes a switching thin film transistor and a connection electrode in the pixel region; and
    the connection electrode electrically connects the driving thin film transistor with the organic electroluminescent diode.
16. The device according to claim 15, wherein:
    the organic electroluminescent diode includes a first electrode on an inner surface of the opposing substrate, an organic emitting layer on the first electrode, and a second electrode on the organic emitting layer;
    the connection spacer includes a patterned spacer and a portion of the second electrode on the patterned spacer; and
    the portion of the second electrode contacts the connection electrode.
17. The device according to claim 1, wherein:
    the organic electroluminescent diode includes a first electrode on an inner surface of the opposing substrate, an organic emitting layer on the first electrode, and a second electrode on the organic emitting layer; and
    the connection spacer connect the second electrode and a drain electrode of the driving thin film transistor.

* * * * *